United States Patent
Adachi et al.

(10) Patent No.: US 12,041,727 B2
(45) Date of Patent: Jul. 16, 2024

(54) SURFACE-TREATED GLASS CLOTH, PREPREG, AND PRINTED WIRING BOARD

(71) Applicant: NITTO BOSEKI CO., LTD., Fukushima (JP)

(72) Inventors: Kazutaka Adachi, Fukushima (JP); Kohei Matsumoto, Fukushima (JP)

(73) Assignee: Nitto Boseki Co., Ltd., Fukushima (JP)

( * ) Notice: Subject to any disclaimer, the term of this patent is extended or adjusted under 35 U.S.C. 154(b) by 231 days.

(21) Appl. No.: 17/797,597

(22) PCT Filed: Jul. 12, 2021

(86) PCT No.: PCT/JP2021/026128
§ 371 (c)(1),
(2) Date: Aug. 4, 2022

(87) PCT Pub. No.: WO2022/024733
PCT Pub. Date: Feb. 3, 2022

(65) Prior Publication Data
US 2023/0071895 A1    Mar. 9, 2023

(30) Foreign Application Priority Data
Jul. 27, 2020   (JP) ................................ 2020-126193

(51) Int. Cl.
*H05K 3/24* (2006.01)
*H05K 1/03* (2006.01)
*H05K 3/28* (2006.01)

(52) U.S. Cl.
CPC .......... *H05K 3/285* (2013.01); *H05K 1/0366* (2013.01); *H05K 3/249* (2013.01); *H05K 2203/1377* (2013.01)

(58) Field of Classification Search
CPC ...... H05K 3/249; H05K 3/285; H05K 1/0366; H05K 2203/1377
See application file for complete search history.

(56) References Cited

U.S. PATENT DOCUMENTS

| | | | |
|---|---|---|---|
| 4,865,910 A | 9/1989 | Inoguchi et al. | |
| 2011/0088933 A1* | 4/2011 | Amou | H05K 3/385 174/257 |
| 2012/0193129 A1* | 8/2012 | Ito | C09K 19/3809 174/254 |

FOREIGN PATENT DOCUMENTS

| | | |
|---|---|---|
| JP | H01-139628 A | 6/1989 |
| JP | H05-125663 A | 5/1993 |
| JP | H06-228439 A | 8/1994 |
| JP | 2003-155670 A | 5/2003 |
| JP | 2003-183982 A | 7/2003 |
| JP | 2005-133272 A | 5/2005 |
| JP | 2011-080170 A | 4/2011 |
| JP | 2013-030724 A | 2/2013 |
| JP | 2013-199088 A | 10/2013 |
| JP | 2013-208891 A | 10/2013 |

OTHER PUBLICATIONS

The extended European Search Report dated Dec. 21, 2023 issued in the corresponding EP Patent Application No. 21849546.3.

* cited by examiner

*Primary Examiner* — Sherman Ng
(74) *Attorney, Agent, or Firm* — Carrier, Shende & Associates P.C.; Joseph P. Carrier; Fulchand P. Shende

(57) ABSTRACT

Provided are a surface-treated glass cloth that enables the reliability of a printed wiring board to be improved, a prepreg, and a printed wiring board. In the surface-treated glass cloth, a surface-treated layer contains a silane coupling agent, the amount of carbon attached of an adhering component of the surface-treated layer is in the range of 0.030 to 0.060% by mass, the arithmetic average height of the surface of the adhering component of the surface-treated layer is in the range of 1.0 to 3.0 nm, and the product of the amount of carbon attached of the adhering component and the arithmetic average height of the surface of the adhering component is in the range of 0.060 to 0.100.

5 Claims, No Drawings

SURFACE-TREATED GLASS CLOTH, PREPREG, AND PRINTED WIRING BOARD

TECHNICAL FIELD

The present invention relates to a surface-treated glass cloth, a prepreg, and a printed wiring board.

BACKGROUND ART

A glass cloth surface-treated with a silane coupling agent in order to improve its adhesion to a resin has been conventionally known as a glass cloth for use in a printed wiring board (see, e.g., Patent Literature 1).

According to the surface-treated glass cloth described in Patent Literature 1, the texture becomes harder, no pulled stitch or bowed filling occurs during winding, and the production efficiency is improved.

CITATION LIST

Patent Literature

Patent Literature 1: Japanese Patent Laid-Open No. H5-125663

SUMMARY OF INVENTION

Technical Problem

Incidentally, in recent years, further improvement in the reliability of printed wiring boards has been desired because of reduction in the size and thickness of electronic devices.

In view of the above situation, an object of the present invention is to provide a surface-treated glass cloth that enables the reliability of a printed wiring board to be improved, a prepreg including the surface-treated glass cloth, and a printed wiring board including the surface-treated glass cloth.

Solution to Problem

It is known that the reliability of a printed wiring board can be improved by inhibiting surface peeling between the glass and the resin and is closely related to the state of the surface-treated layer of a surface-treated glass cloth. The state of the surface-treated layer has been conventionally evaluated by the amount of a silane coupling agent attached thereto. As a result of diligent studies on the state of the surface-treated layer of surface-treated glass cloths, the present inventors have found that allowing the amount of the component adhering to the surface of a surface-treated glass cloth and the surface height to fall within a specific range, even with the same amount attached, is effective for improving the reliability of the printed wiring board (whitening distance), having accomplished the present invention.

Here, the whitening distance is an index indicating the degree of interfacial peeling between the glass and the resin on the surface-treated layer. Accordingly, the smaller the whitening distance, the higher the reliability of the printed wiring board.

Thus, in order to achieve the object, the surface-treated glass cloth of the present invention is a surface-treated glass cloth comprising a surface-treated layer on the surface thereof, wherein the surface-treated layer contains a silane coupling agent, the amount of carbon attached of an adhering component of the surface-treated layer is in the range of 0.030 to 0.060% by mass, the arithmetic average height of the surface of the adhering component of the surface-treated layer is in the range of 1.0 to 3.0 nm, and the product of the amount of carbon attached of the adhering component and the arithmetic average height of the surface of the adhering component is in the range of 0.060 to 0.100.

According to the surface-treated glass cloth of the present invention, when the product of the amount of carbon attached of the adhering component and the arithmetic average height of the surface of the adhering component is in the range of 0.060 to 0.100, the reliability of the printed wiring board can be improved.

In the surface-treated glass cloth of the present invention, when the product of the amount of carbon attached of the adhering component and the arithmetic average height of the surface of the adhering component is less than 0.060, the reliability of the printed wiring board cannot be sufficiently improved. When the product of the amount of carbon attached of the adhering component and the arithmetic average height of the surface of the adhering component exceeds 0.100, the adhering component forms a mass, the surface is non-uniformly treated, and the interfacial adhesion decreases.

In the surface-treated glass cloth of the present invention, the product of the amount of carbon attached of the adhering component and the arithmetic average height of the surface of the adhering component is preferably in the range of 0.075 to 0.097, more preferably in the range of 0.086 to 0.093.

In the glass cloth of the present invention, the silane coupling agent is preferably a silane coupling agent having at least one methacryloyl group or acryloyl group and is more preferably a silane coupling agent having a methacryloyl group.

The prepreg of the present invention comprises the surface-treated glass cloth of the present invention, and the printed wiring board of the present invention comprises the surface-treated glass cloth of the present invention.

DESCRIPTION OF EMBODIMENT

Hereinafter, embodiments of the present invention will be described in detail.

A surface-treated glass cloth of the present embodiment comprises a surface-treated layer on the surface thereof, the surface-treated layer contains a silane coupling agent, the amount of carbon attached of an adhering component of the surface-treated layer is in the range of 0.030 to 0.060% by mass, the arithmetic average height of the surface of the adhering component of the surface-treated layer is in the range of 1.0 to 3.0 nm, and the product of the amount of carbon attached of the adhering component and the arithmetic average height of the surface of the adhering component is in the range of 0.060 to 0.100, preferably in the range of 0.075 to 0.097, more preferably in the range of 0.086 to 0.093.

The surface-treated glass cloth of the present embodiment can be produced in the manner as described below, for example.

First, a predetermined glass batch (glass raw material) is melted and formed into fiber to thereby obtain glass filaments. The glass composition constituting the glass filaments is not particularly limited, and preferable compositions are E glass, T glass, NE glass, L glass, and the like. In view of low dielectric constant and low dielectric tangent, NE glass and L glass are more preferred. Specifically, still preferred is a composition including $SiO_2$ in the range of 48.0 to 62.0% by mass, $B_2O_3$ in the range of 17.0 to 26.0% by mass, $Al_2O_3$ in the range of 9.0 to 18.0% by mass, MgO in the range of 0 to 6.0% by mass, CaO in the range of 0.1 to 9.0% by mass, $Na_2O$, $K_2O$, and $Li_2O$ in the range of 0 to 0.5% by mass in total, $TiO_2$ in the range of 0 to 5.0% by mass, SrO in the range of 0 to 6.0% by mass, $P_2O_5$ in the range of 0 to 6.0% by mass, and $F_2$ and $Cl_2$ in the range of 0 to 3.0% by mass in total, with respect to the total amount.

Regarding measurement of the content of each component in the glass composition mentioned above, the content of Li as a light element can be measured with an ICP emission spectroscopic analyzer, and the contents of the other elements can be measured with a wavelength dispersive X-ray fluorescence analyzer.

Regarding the measurement method, a glass cloth (when organic matter adheres to the glass cloth surface, or when the glass cloth is mainly included as a reinforcing material in organic matter (resin), the glass cloth is used after the organic matter is removed by, for example, heating in a muffle furnace at a temperature in the range of 300 to 600° C. for a period in the range of 2 to 24 hours) is cut into an appropriate size, then the cut glass cloth is placed in a platinum crucible and melted with stirring while being held at a temperature of 1550° C. for 6 hours in an electric furnace to obtain a homogeneous molten glass. Next, the obtained molten glass is poured onto a carbon plate to produce a glass cullet, and then pulverized into powder. Regarding Li as a light element, glass powder is thermally decomposed with an acid and then quantitatively analyzed using an ICP emission spectroscopic analyzer. Regarding other elements, glass powder is molded into a disc shape by a pressing machine and then quantitatively analyzed using a wavelength dispersive X-ray fluorescence analyzer. These quantitative analysis results are converted in terms of oxides to calculate the content of each component and the total amount, and the above content (% by mass) of each component can be determined from these numerical values.

The filament diameter of the glass filament is not particularly limited, and for printed wiring board applications, is preferably 10 μm or less, more preferably 8 μm or less, particularly preferably in the range of 3 to 5 μm.

The glass filaments are bundled, for example, in the range of 25 to 500 filaments, preferably in the range of 40 to 300 filaments by a method known per se to be formed into a glass fiber yarn. Obtaining glass filaments by melting a glass batch and making the molten glass batch into fibers followed by obtaining a glass fiber yarn by bundling a plurality of the glass filaments is referred to as spinning.

The yarn count of the glass fiber yarn is preferably in the range of 0.8 to 135 tex, more preferably in the range of 1 to 25 tex. The yarn count of the glass fiber yarn (tex) corresponds to the mass per 1000 m of the glass fiber (unit: g).

Next, the glass fiber yarn is woven as the warp yarn or weft yarn to obtain the glass cloth. The weaving method is not particularly limited, examples thereof include plain weaving, satin weaving, and twill weaving, and plain weaving is preferable. The weaving density of the glass fiber yarn during the weaving is not particularly limited, and is, for example, preferably in the range of 10 to 150 yarns/25 mm, more preferably in the range of 40 to 100 yarns/25 mm.

During the weaving, a sizing agent is used for bundling of the glass filament, warping of the warp yarn, and the like. Examples of the sizing agent include sizing agents of which the film-forming agent component is based on starch or PVA (polyvinyl alcohol). The sizing agent may contain an oil agent, a softener, or the like.

The amount of the sizing agent attached in the glass cloth is preferably in the range of 0.1 to 3 parts by mass, more preferably in the range of 0.5 to 1.5 parts by mass based on 100 parts by mass of the glass fiber yarn. The range of the amount of the sizing agent attached and the amount of the sizing agent attached, when not particularly specified, represent the average of the amount of the sizing agent attached to the warp yarn or weft yarn.

The glass cloth obtained by the weaving preferably has a mass per its unit area of 110 $g/m^2$ or less from the viewpoint of application for printed wiring board substrates. Meanwhile, from the viewpoint of weaving performance, the mass per unit area of the glass cloth is preferably 8 $g/m^2$ or more.

Next, the glass cloth is subjected to opening treatment. Examples of the opening treatment may include opening treatment by means of water flow pressure, opening treatment by means of high-frequency vibration using a liquid as a medium, opening treatment by means of the pressure of a fluid having a surface pressure, and opening treatment by means of pressing with a roll. Among the opening treatments, opening treatment by means of water flow pressure or opening treatment by means of high-frequency vibration using a liquid as a medium is preferably used because variations in the yarn width in each of the warp yarns and the weft yarns after the opening treatment are reduced. As the opening treatment, a plurality of treating methods may be used in combination.

Next, the opening-treated glass cloth is subjected to desizing treatment. The desizing treatment can be carried out, for example, by placing the glass cloth in a heating oven at an atmosphere temperature in the range of 350 to 450° C. for a period in the range of 40 to 80 hours to thereby pyrolytically decompose a size binder for spinning and a size binder for weaving attached to the glass cloth.

Next, the desized glass cloth is immersed in a surface treatment agent aqueous solution and excess moisture is squeezed. Then, the glass cloth is heat-dried at a temperature in the range of 80 to 180° C. for a period of 1 to 30 minutes, for example, at 110° C. for 5 minutes to thereby obtain the surface-treated glass cloth of the present embodiment.

As the surface treatment agent aqueous solution, an aqueous solution can be used that contains a silane coupling agent having at least one methacryloyl group or acryloyl group in the range of 0.1 to 2.0% by mass as solid contents and contains a weak acid (e.g., acetic acid, citric acid, or propionic acid) as a pH adjuster in the range of 0.5 to 2.0% by mass based on the total amount of the surface treatment agent aqueous solution. The weak acid serves as a catalyst for hydrolysis reaction of the silane coupling agent. Thus, an insufficient amount of the weak acid leads to insufficient hydrolysis of the silane coupling agent, resulting in a smaller amount adhering to the glass surface.

Examples of the silane coupling agent having at least one methacryloyl group include 3-methacryloxypropylmethyldimethoxysilane, 3-methacryloxypropyltrimethoxysilane, 3-methacryloxypropylmethyldiethoxysilane, and 3-methacryloxypropyltriethoxysilane Examples of the silane coupling agent having at least one acryloyl group include 3-acryloxypropylmethyldimethoxysilane, 3-acryloxypropyltrimethoxysilane, 3-acryloxypropylmethyldiethoxysilane, and 3-acryloxypropyltriethoxysilane. The amount of the silane coupling agent attached to the glass cloth is preferably in the range of 0.01 to 5 parts by mass based on 100 parts by mass of the glass fiber yarn.

Here, attachment of the silane coupling agent to the glass surface includes attachment in which the silane coupling agent chemically firmly adheres to the glass surface and attachment in which the silane coupling agent only physically adsorbs to the glass surface. Then, in the present invention, the component chemically firmly adhering, excluding the physically adsorbing component, is regarded as an adhering component, and the amount of the adhering component is taken as the amount adhering.

The adhering component is specifically the component that adheres to a surface-treated glass cloth after immersion of the surface-treated glass cloth in ethanol for 60 seconds and sufficient drying of the glass cloth in a dryer heated to 110° C. for 30 minutes. The amount of carbon attached of the adhering component is measured by a total nitrogen/total carbon content measurement apparatus (manufactured by Sumika Chemical Analysis Service, Ltd., trade name: NC-TRINITY).

The arithmetic average height of the surface of the adhering component is measured by disposing a 2 cm-square piece cut from a surface-treated glass cloth on the sample mount of an atomic force microscope (AFM, manufactured by Park Systems Corporation, trade name: NX20) and performing surface profile measurement on the top portion of monofilaments in the surface-treated glass cloth piece. The measurement by the atomic force microscope was performed while the scan rate is set to 0.60 Hz, the number of pixels is set to 256 pixels in height and 256 pixels in width, and the surface measurement region is set to a 4 μm square.

The thickness of the surface-treated glass cloth is preferably 110 μm or less from the viewpoint of application for printed wiring board substrates. Meanwhile, from the viewpoint of handleability, the thickness is preferably 8 μm or more.

Next, Examples, Comparative Examples, and Reference Examples of the present invention will be shown.

EXAMPLES

Example 1

In the present Example, a glass cloth in accordance with IPC4412 standard #2116 (glass composition: NE glass, yarn used: E250, (fiber diameter: 7 μm, yarn weight: 20.8 g/1000 m), warp yarn weaving density: 59 yarns/25 mm, weft yarn weaving density: 57 yarns/25 mm, weight per unit area: 95 g/m$^2$) was woven, heated at a temperature of 400 to 450° C. for 60 hours, and subjected to desizing treatment. Thereafter, the glass cloth was immersed in a glass treatment agent aqueous solution, and excess moisture was squeezed. Then, the glass cloth was heat-dried at 110° C. for 5 minutes to thereby obtain a surface-treated glass cloth having a thickness of 90 μm.

The glass treatment agent aqueous solution was prepared by mixing 3-methacryloxypropyltrimethoxysilane (manufactured by Dow Toray Co., Ltd.) as a silane coupling agent into water such that the solid content reached 1.0% by mass and the propionic acid accounted for 0.5% by mass and stirring the mixture with a magnetic stirrer for 1 hour.

The resulting surface-treated glass cloth was cut into a size of 350 mm×400 mm, which was used as a surface-treated glass cloth piece. At this time, the amount of the silane coupling agent attached to the cut glass cloth was 0.13 parts by mass based on 100 parts by mass of the glass fiber yarn.

Next, the surface-treated glass cloth piece was immersed in polyphenylene ether resin varnish and preliminary dried at a temperature of 150° C. for 10 minutes to obtain a prepreg. The polyphenylene ether resin varnish comprises 450 parts by mass of oligophenylene ether (manufactured by Mitsubishi Gas Chemical Company, Inc., trade name OPE-2St), 100 parts by mass of triallyl isocyanurate (manufactured by Evonik Japan Co., Ltd., trade name: TAICROS), 4 parts by mass of α,α'-dlitert-butylperoxy)diisopropylbenzene (manufactured by NOF CORPORATION, trade name PERBUTYL P), and 250 parts by mass of toluene (manufactured by FUJIFILM Wako Pure Chemical Corporation).

Next, 4 sheets of the prepreg were laminated, a cellophane film was layered above and below the prepreg, and the laminate was hot-pressed using a vacuum hot press (manufactured by Kitagawa Seiki Co., Ltd.) under conditions of 205° C. and 18 kgf/cm$^2$ in vacuo for 1 hour to obtain a laminate plate having a plate thickness of approximately 0.3 mm.

Next, the surface-treated glass cloth piece obtained in the present Example was immersed in ethanol for 60 seconds and sufficiently dried in a drier heated to 110° C. for 30 minutes. Thereafter, the amount of carbon attached of the adhering component attached to the surface-treated glass cloth piece was measured by a total nitrogen/total carbon content measurement apparatus (manufactured by Sumika Chemical Analysis Service, Ltd., trade name: NC-TRINITY). The surface-treated glass cloth piece obtained in the present Example was further cut into a 2-cm square, which was disposed on the sample mount of an atomic force microscope (AFM, manufactured by Park Systems Corporation, trade name: NX20). The arithmetic average height of the surface of the adhering component was measured by surface profile measurement on the top portion of monofilaments in the surface-treated glass cloth piece while the scan rate was set to 0.60 Hz, the number of pixels was set to 256 pixels in height and 256 pixels in width, and the surface measurement region was set to a 4 μm square.

Next, the product of the amount of carbon attached of the adhering component and the arithmetic average height of the surface of the adhering component was determined from the measurement results.

Next, the laminate plate obtained in the present Example was cut out into a size of 7 cm×4 cm, and a slit of 2 cm was cut therein both vertically and horizontally to form a specimen. A 1 mol/L NaOH (manufactured by FUJIFILM Wako Pure Chemical Corporation) aqueous solution prepared was placed in a beaker and heated to a temperature of 60° C. After the specimen was immersed in the aqueous solution for 30 hours, the whitening distance resulted due to interfacial peeling between the glass and the resin in the warp yarn direction and the weft yarn direction was measured using a digital microscope (manufactured by KEYENCE CORPORATION) at a magnification of 100. The measurement was performed at 24 points each in the warp yarn direction and the weft yarn direction, and the average value was calculated and taken as the whitening distance. The whitening distance resulted due to this peeling is correlated with the insulating reliability of the substrate, and a smaller whitening distance is more preferred.

The results are shown in Table 1. In Table 1, 3-methacryloxypropyltrimethoxysilane is represented as "Methacryl", and the glass treatment agent aqueous solution is represented as Treatment liquid.

Example 2

In the present Example, a surface-treated glass cloth, a prepreg, and a laminate plate were obtained exactly in the same manner as in Example 1 except that the amount of propionic acid contained in the glass treatment agent aqueous solution was set to 1.0% by mass.

Next, exactly in the same manner as in Example 1 except that the surface-treated glass cloth obtained in the present Example was used, the amount of carbon attached of the adhering component and the arithmetic average height of the surface of the adhering component were measured, and the product of the amount of carbon attached of the adhering component and the arithmetic average height of the surface of the adhering component was determined from the measurement results.

Next, exactly in the same manner as in Example 1 except that the laminate plate obtained in the present Example was used, the whitening distance was determined. The results are shown in Table 1.

Example 3

In the present Example, a surface-treated glass cloth, a prepreg, and a laminate plate were obtained exactly in the same manner as in Example 1 except that, as the silane coupling agent contained in the glass treatment agent aqueous solution, 3-acryloxypropyltrimethoxysilane (manufactured by Shin-Etsu Chemical Co., Ltd.) was used instead of 3-methacryloxypropyltrimethoxysilane (manufactured by Dow Toray Co., Ltd.).

Next, exactly in the same manner as in Example 1 except that the surface-treated glass cloth obtained in the present Example was used, the amount of carbon attached of the adhering component and the arithmetic average height of the surface of the adhering component were measured, and the product of the amount of carbon attached of the adhering component and the arithmetic average height of the surface of the adhering component was determined from the measurement results.

Next, exactly in the same manner as in Example 1 except that the laminate plate obtained in the present Example was used, the whitening distance was determined. The results are shown in Table 2. In Table 2, 3-acryloxypropyltrimethoxysilane is represented as "Acryl", and the glass treatment agent aqueous solution is represented as Treatment liquid.

Example 4

In the present Example, a surface-treated glass cloth, a prepreg, and a laminate plate were obtained exactly in the same manner as in Example 3 except that the amount of propionic acid contained in the glass treatment agent aqueous solution was set to 1.0% by mass.

Next, exactly in the same manner as in Example 1 except that the surface-treated glass cloth obtained in the present Example was used, the amount of carbon attached of the adhering component and the arithmetic average height of the surface of the adhering component were measured, and the product of the amount of carbon attached of the adhering component and the arithmetic average height of the surface of the adhering component was determined from the measurement results.

Next, exactly in the same manner as in Example 1 except that the laminate plate obtained in the present Example was used, the whitening distance was determined. The results are shown in Table 2.

Example 5

In the present Example, a surface-treated glass cloth, a prepreg, and a laminate plate were obtained exactly in the same manner as in Example 3 except that the amount of propionic acid contained in the glass treatment agent aqueous solution was set to 2.0% by mass.

Next, exactly in the same manner as in Example 1 except that the surface-treated glass cloth obtained in the present Example was used, the amount of carbon attached of the adhering component and the arithmetic average height of the surface of the adhering component were measured, and the product of the amount of carbon attached of the adhering component and the arithmetic average height of the surface of the adhering component was determined from the measurement results.

Next, exactly in the same manner as in Example 1 except that the laminate plate obtained in the present Example was used, the whitening distance was determined. The results are shown in Table 2.

Comparative Example 1

In the present Comparative Example, a surface-treated glass cloth, a prepreg, and a laminate plate were obtained exactly in the same manner as in Example 1 except that the amount of propionic acid contained in the glass treatment agent aqueous solution was set to 0.1% by mass.

Next, exactly in the same manner as in Example 1 except that the surface-treated glass cloth obtained in the present Comparative Example was used, the amount of carbon attached of the adhering component and the arithmetic average height of the surface of the adhering component were measured, and the product of the amount of carbon attached of the adhering component and the arithmetic average height of the surface of the adhering component was determined from the measurement results.

Next, exactly in the same manner as in Example 1 except that the laminate plate obtained in the present Comparative Example was used, the whitening distance was determined. The results are shown in Table 1.

Comparative Example 2

In the present Comparative Example, a surface-treated glass cloth, a prepreg, and a laminate plate were obtained exactly in the same manner as in Example 1 except that the amount of propionic acid contained in the glass treatment agent aqueous solution was set to 0.3% by mass.

Next, exactly in the same manner as in Example 1 except that the surface-treated glass cloth obtained in the present Comparative Example was used, the amount of carbon attached of the adhering component and the arithmetic average height of the surface of the adhering component were measured, and the product of the amount of carbon attached of the adhering component and the arithmetic average height of the surface of the adhering component was determined from the measurement results.

Next, exactly in the same manner as in Example 1 except that the laminate plate obtained in the present Comparative Example was used, the whitening distance was determined. The results are shown in Table 1.

Comparative Example 3

In the present Comparative Example, a surface-treated glass cloth, a prepreg, and a laminate plate were obtained exactly in the same manner as in Example 3 except that the amount of propionic acid contained in the glass treatment agent aqueous solution was set to 0.1% by mass.

Next, exactly in the same manner as in Example 1 except that the surface-treated glass cloth obtained in the present Comparative Example was used, the amount of carbon attached of the adhering component and the arithmetic average height of the surface of the adhering component were measured, and the product of the amount of carbon attached of the adhering component and the arithmetic average height of the surface of the adhering component was determined from the measurement results.

Next, exactly in the same manner as in Example 1 except that the laminate plate obtained in the present Comparative Example was used, the whitening distance was determined. The results are shown in Table 2.

Reference Example 1

In the present Reference Example, a surface-treated glass cloth, a prepreg, and a laminate plate were obtained exactly in the same manner as in Example 1 except that no propionic acid was added at all to the glass treatment agent aqueous solution.

Next, exactly in the same manner as in Example 1 except that the surface-treated glass cloth obtained in the present Reference Example was used, the amount of carbon attached of the adhering component and the arithmetic average height of the surface of the adhering component were measured, and the product of the amount of carbon attached of the adhering component and the arithmetic average height of the surface of the adhering component was determined from the measurement results.

Next, exactly in the same manner as in Example 1 except that the laminate plate obtained in the present Reference Example was used, the whitening distance was determined. The results are shown in Table 1.

Reference Example 2

In the present Reference Example, a surface-treated glass cloth, a prepreg, and a laminate plate were obtained exactly in the same manner as in Example 3 except that no propionic acid was added at all to the glass treatment agent aqueous solution.

Next, exactly in the same manner as in Example 1 except that the surface-treated glass cloth obtained in the present Reference Example was used, the amount of carbon attached of the adhering component and the arithmetic average height of the surface of the adhering component were measured, and the product of the amount of carbon attached of the adhering component and the arithmetic average height of the surface of the adhering component was determined from the measurement results.

Next, exactly in the same manner as in Example 1 except that the laminate plate obtained in the present Reference Example was used, the whitening distance was determined. The results are shown in Table 2.

The "whitening distance indexes" in Tables 1 and 2 represent the proportion of a whitening distance with respect to the whitening distance of the laminate plate when no propionic acid was added at all to the glass treatment agent aqueous solution (acid concentration: 0%), taken as 1. A smaller whitening distance index indicates that reliability in the printed wiring board has been more improved. Specifically, the whitening distance indexes in Examples 1 and 2 and Comparative Examples 1 and 2 represent the proportion of a whitening distance with respect to the whitening distance of Reference Example 1 taken as 1, and the whitening distance indexes of Examples 3 to 5 and Comparative Example 3 represent the proportion of a whitening distance with respect to the whitening distance of Reference Example 2 taken as 1.

TABLE 1

|  | Reference Example 1 | Comparative Example 1 | Comparative Example 2 | Example 1 | Example 2 |
|---|---|---|---|---|---|
| Silane coupling agent | Methacryl | Methacryl | Methacryl | Methacryl | Methacryl |
| Concentration of propionic acid in treatment liquid (wt %) | 0 | 0.1 | 0.3 | 0.5 | 1.0 |
| Treatment liquid pH | 5.2 | 3.5 | 3.4 | 3.3 | 3.1 |
| Amount attached (%) | 0.109 | 0.119 | 0.131 | 0.131 | 0.133 |
| Amount of carbon attached of adhering component (%) | 0.016 | 0.023 | 0.028 | 0.035 | 0.035 |
| Arithmetic average height of surface of adhering component (nm) | 0.9 | 1.8 | 2 | 2.6 | 2.5 |
| Amount of carbon attached of adhering component × arithmetic average height of surface | 0.014 | 0.041 | 0.056 | 0.091 | 0.088 |
| Whitening distance (µm) | 364 | 230 | 221 | 156 | 164 |
| Whitening distance index when whitening distance at acid concentration of 0% is taken as 1 | 1.00 | 0.63 | 0.61 | 0.43 | 0.45 |

TABLE 2

|  | Reference Example 2 | Comparative Example 3 | Example 3 | Example 4 | Example 5 |
|---|---|---|---|---|---|
| Silane coupling agent | Acryl | Acryl | Acryl | Acryl | Acryl |
| Concentration of propionic acid in treatment liquid (wt %) | 0 | 0.1 | 0.5 | 1.0 | 2.0 |
| Treatment liquid pH | 7.3 | 4.1 | 3.5 | 3.3 | 3.2 |
| Amount attached (%) | 0.112 | 0.129 | 0.132 | 0.135 | 0.135 |

TABLE 2-continued

|  | Reference Example 2 | Comparative Example 3 | Example 3 | Example 4 | Example 5 |
|---|---|---|---|---|---|
| Amount of carbon attached of adhering component (%) | 0.029 | 0.041 | 0.052 | 0.052 | 0.055 |
| Arithmetic average height of surface of adhering component (nm) | 0.5 | 0.7 | 1.6 | 1.2 | 1.2 |
| Amount of carbon attached of adhering component × arithmetic average height of surface | 0.015 | 0.029 | 0.083 | 0.062 | 0.066 |
| Whitening distance (μm) | 448 | 293 | 244 | 263 | 258 |
| Whitening distance index when whitening distance at acid concentration of 0% is taken as 1 | 1.00 | 0.65 | 0.54 | 0.59 | 0.58 |

As obviously seen from Table 1 and 2, according to the laminate plates including the surface-treated glass cloths of Examples 1 to 5, in which the amount of carbon attached of the adhering component of the surface-treated layer is in the range of 0.030 to 0.060% by mass, the arithmetic average height of the surface of the adhering component of the surface-treated layer is in the range of 1.0 to 3.0 nm, and the product of the amount of carbon attached of the adhering component and the arithmetic average height of the surface of the adhering component is in the range of 0.060 to 0.100, the whitening distance index is smaller and the reliability has been improved in comparison with the laminate plates including the surface-treated glass cloth of Comparative Examples 1 to 3.

The invention claimed is:

1. A surface-treated glass cloth comprising a surface-treated layer on a surface thereof, wherein
the surface-treated layer contains a silane coupling agent,
an amount of carbon attached of an adhering component of the surface-treated layer is in a range of 0.030 to 0.060% by mass,
an arithmetic average height of a surface of the adhering component of the surface-treated layer is in a range of 1.0 to 3.0 nm, and
a product of the amount of carbon attached of the adhering component and the arithmetic average height of the surface of the adhering component is in a range of 0.060 to 0.100.

2. The surface-treated glass cloth according to claim 1, wherein
the product of the amount of carbon attached of the adhering component and the arithmetic average height of the surface of the adhering component is in a range of 0.086 to 0.093.

3. The surface-treated glass cloth according to claim 1, wherein
the silane coupling agent is a silane coupling agent having at least one methacryloyl group or acryloyl group.

4. A prepreg comprising the surface-treated glass cloth according to claim 1.

5. A printed wiring board comprising the surface-treated glass cloth according to claim 1.

* * * * *